United States Patent
Hwang et al.

(10) Patent No.: US 9,129,899 B2
(45) Date of Patent: Sep. 8, 2015

(54) METHOD AND SYSTEM FOR THINNING WAFER THEREOF

(71) Applicant: Taiwan Semiconductor Manufacturing Co., Ltd., Hsin-Chu (TW)

(72) Inventors: Chien-Ling Hwang, Hsinchu (TW); Bor-Ping Jang, Chu-Bei (TW); Hsin-Hung Liao, Hsinchu (TW); Chung-Shi Liu, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 36 days.

(21) Appl. No.: 13/944,257

(22) Filed: Jul. 17, 2013

(65) Prior Publication Data

US 2015/0024606 A1    Jan. 22, 2015

(51) Int. Cl.
*H01L 21/302* (2006.01)
*H01L 21/306* (2006.01)
*H01L 21/308* (2006.01)

(52) U.S. Cl.
CPC ...... *H01L 21/30604* (2013.01); *H01L 21/3081* (2013.01); *H01L 21/3083* (2013.01)

(58) Field of Classification Search
CPC . H01L 21/00; H01L 21/3081; H01L 21/3083; H01L 21/30604
USPC .......... 438/458, 459, 464, 469, 774; 428/446, 428/450, 620, 66.7, 220, 691
See application file for complete search history.

(56) References Cited

U.S. PATENT DOCUMENTS

| | | | | |
|---|---|---|---|---|
| 6,162,702 A | * | 12/2000 | Morcom et al. | 438/459 |
| 7,354,649 B2 | * | 4/2008 | Dolechek et al. | 428/446 |
| 7,952,170 B2 | * | 5/2011 | Pratt | 257/621 |

* cited by examiner

*Primary Examiner* — Lan Vinh
*Assistant Examiner* — Maki Angadi
(74) *Attorney, Agent, or Firm* — Birch, Stewart, Kolasch & Birch, LLP

(57) ABSTRACT

Embodiments of a method for thinning a wafer are provided. The method includes placing a wafer on a support assembly and securing an etching mask to a backside of the wafer. The etching mask covers a peripheral portion of the wafer. The method further includes performing a wet etching process on the backside of the wafer to form a thinned wafer, and the thinned wafer includes peripheral portions having a first thickness and a central portion having a second thickness smaller than the first thickness. Embodiments of system for forming the thinned wafer are also provided.

16 Claims, 9 Drawing Sheets

METHOD AND SYSTEM FOR THINNING WAFER THEREOF

BACKGROUND

The semiconductor integrated circuit (IC) industry has experienced exponential growth in recent year. Technological advances in IC design and material have produced generations of ICs where each generation has smaller and more complex circuits than previous generations. In the course of IC evolution, functional density (i.e., the number of interconnected devices per chip area) has generally increased while geometric size (i.e., the smallest component (or line) that can be fabricated) has decreased. This scaling down process generally provides benefits by increasing production efficiency and lowering associated costs.

Integrated circuits are formed on semiconductor wafers. The semiconductor wafers are then sawed into chips. The formation of integrated circuits includes many process steps such as deposition, chemical mechanical polish (CMP), plating, and the like. Accordingly, wafers are transported between different equipment.

There are challenges in fabricating an advanced integrated circuit (IC) involving thinning a wafer.

BRIEF DESCRIPTION OF THE DRAWING

For a more complete understanding of the present disclosure, and the advantages thereof, reference is now made to the following descriptions taken in conjunction with the accompanying drawings, in which.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Embodiments of the disclosure provide a method and a system for thinning a wafer. In some embodiments, the wafer is thinned by a grinding process by using a grinding wheel. During and after the grinding process, particularly during transportation, the thinned wafer could suffer the risk of breakage and edge chipping. Therefore, a temporary supporting structure (e.g. tape) is necessary to support the thinned wafer. However, there are additionally operations for applying and removing the temporary supporting structure. Additionally, scratches caused by the grinding wheel are formed on the thinned wafer, and as a result an additional polish process is needed to polish the thinned wafer.

Figure 1:
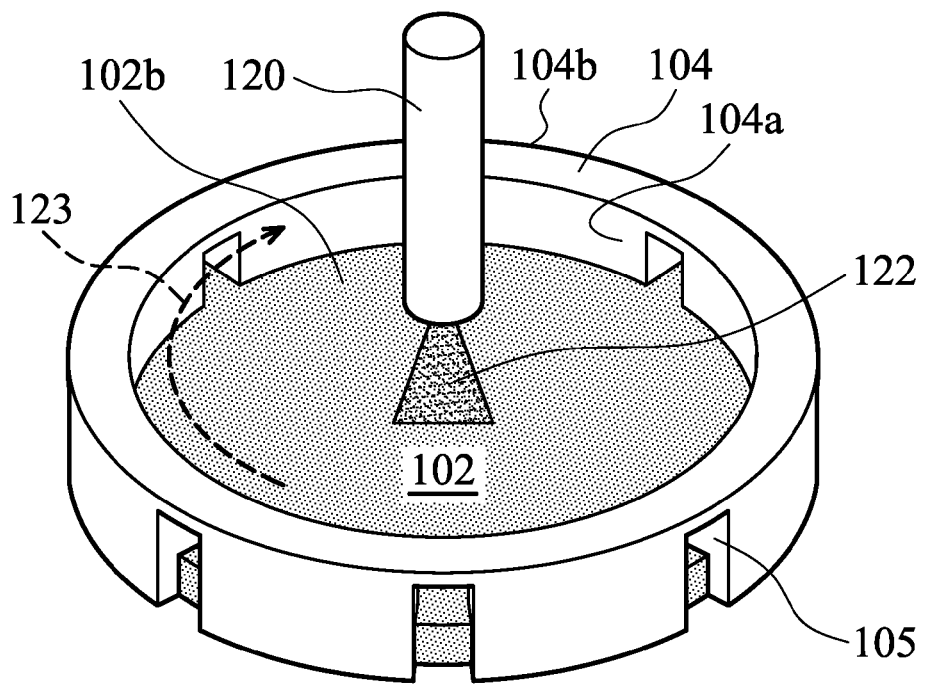
FIG. 1 shows a cross-sectional representation of a method and a system for thinning a wafer in accordance with some embodiments of the disclosure.

In order to reduce the risk of edge breakage and chipping, embodiments of the disclosure provide a method and a system for thinning a wafer. FIG. 1 shows a three dimensional representation of a system for thinning a wafer 102 in accordance with some embodiments of the disclosure. Wafer 102 has a front-side 102a (not shown in FIG. 1, referring to FIG. 2A) and a backside 102b, and the integrated circuits (not shown) are formed on front-side 102a of wafer 102. The front-side 102a of the wafer 102 is protected during the processes. In some embodiments, a supporting structure (such as a glass or a tape) may be additionally adhered to front-side 102a of wafer 102 to improve rigidity and strength of wafer 102.

An etching mask 104 is positioned over backside 102b of wafer 102. In some embodiments, etching mask 104 is in a shape of a ring with an outer edge 104b and an inner edge 104c and covers a part of a peripheral portion of wafer 102. Etching mask 104 further includes openings 105. Detail descriptions of various embodiments of etching mask 104 will be described later.

A wet etching process is performed to backside 102b of wafer 102 to thin wafer 102. The wet etching process is performed by positioning an etching supplier 120 (such as a nozzle) over backside 102b of wafer 102 to provide an etchant 122. In some embodiments, etchant 122 flows along a flowing path 123 in a clockwise direction and is expelled from etching mask 104 through openings 105. In some other embodiments, etchant 122 flows in a counter-clockwise direction (not shown).

Etchant 122 is made of an acidic solution containing acid or alkaline, such as hydrofluoric acid (HF), nitric acid ($HNO_3$) or combinations thereof. In some embodiments, etchant 122 is made of an acidic solution containing nitric acid ($HNO_3$) with a concentration in a range from about 50% to about 90%.

In some embodiments, etchant 122 is made of an acidic solution containing nitric acid ($HNO_3$) with a concentration in a range from about 10% to about 50% mixed with hydrofluoric acid (HF) with a concentration in a range from about 10% to about 50%. An etching rate of the wet etching process varies with the concentration of etchant 122, and therefore the acid concentration of etchant 122 may be adjusted depending on the expected etching rate according to actual applications.

Since etchant 122 is made of an acidic solution, etching mask 104 should be made of an acid-resistant material. In some embodiments, etching mask 104 is made of a ceramic material or polymer(s), such as polytetrafluoroethylene (PTFE) or Teflon.

FIGS. 2A-2F show cross-sectional representations of various stages of a method and a system for thinning backside 102b of wafer 102 illustrated in FIG. 1 in accordance with some embodiments of the disclosure.

Figure 2A:
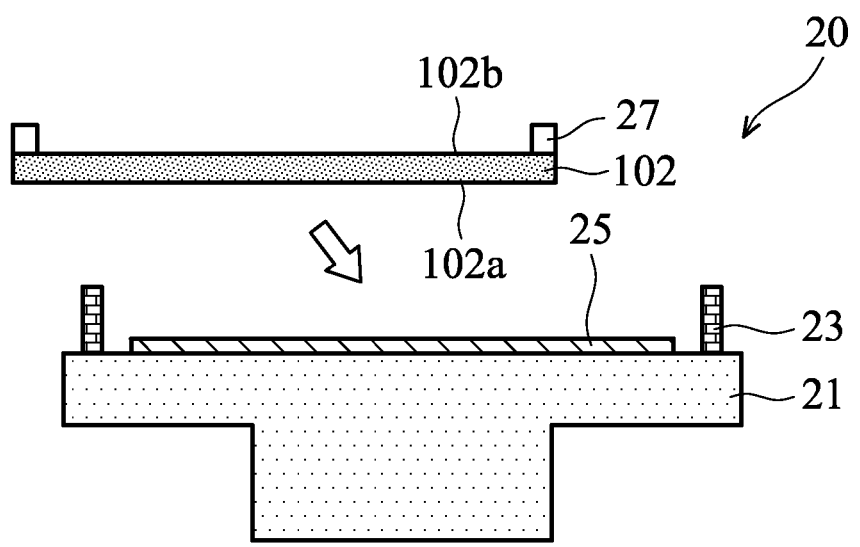
FIGS. 2A-2F shows cross-sectional representations of various stages of a method and a system for thinning the wafer in accordance with some embodiments of the disclosure.

Referring to FIG. 2A, an etching support assembly 20 includes a chuck 21, pins 23, and a cushion 25. Pins 23 and cushion 25 are disposed on chuck 21. Chuck 21 is used to support and secure wafer 102, and cushion 25 is used to protect front-side 102a of wafer 102. Pins 23 are used to secure etching mask 104 during subsequent operations. Since cushion 25 will directly contact wafer 102, cushion 25 is made of yielding materials (such as polymers).

As shown in FIG. 2A, wafer 102 is held by one or more vacuum wand 27 with front-side 102a of wafer 102 facing down. Afterwards, wafer 102 is moved to chuck 21 as indicated by the arrow and is placed on cushion 25.

Figure 2B:
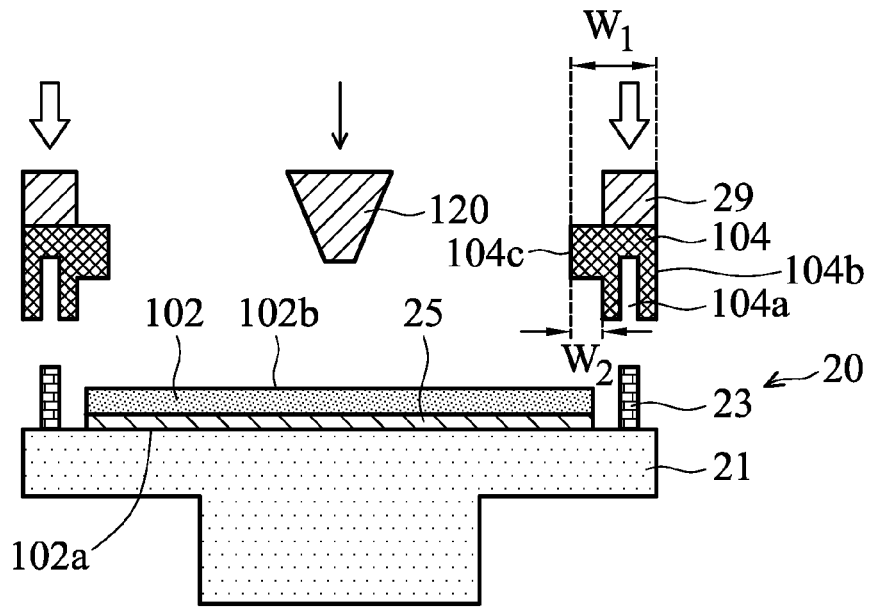

Referring to FIG. 2B, in some embodiments, wafer 102 is positioned on cushion 25, and front-side 102a of wafer 102 contacts cushion 25. Afterwards, etching mask 104 is placed over etching support assembly 20 by one or more vacuum holder 29. Etching mask 104 has holes 104a which is designed to house and align pins 23. As shown in FIG. 2B, etching mask 104 has a width $W_1$ measured from outer edge 104b to inner edge 104c. In some embodiments, the width $W_1$ is in a range from 10 mm to 30 mm. In addition, etching mask 104 is in a shape of a ring and has an extending portion on the ring. The extending portion having a width $W_2$. In some embodiments, the width $W_2$ is in a range from 1.5 mm to 10 mm.

As shown in FIG. 2B, etching supplier 120 is also positioned over wafer 102. In some embodiments, etching supplier 120 is positioned over a central portion of wafer 102 to uniformly provide etchant 122 during the subsequent processes.

Figure 2C:
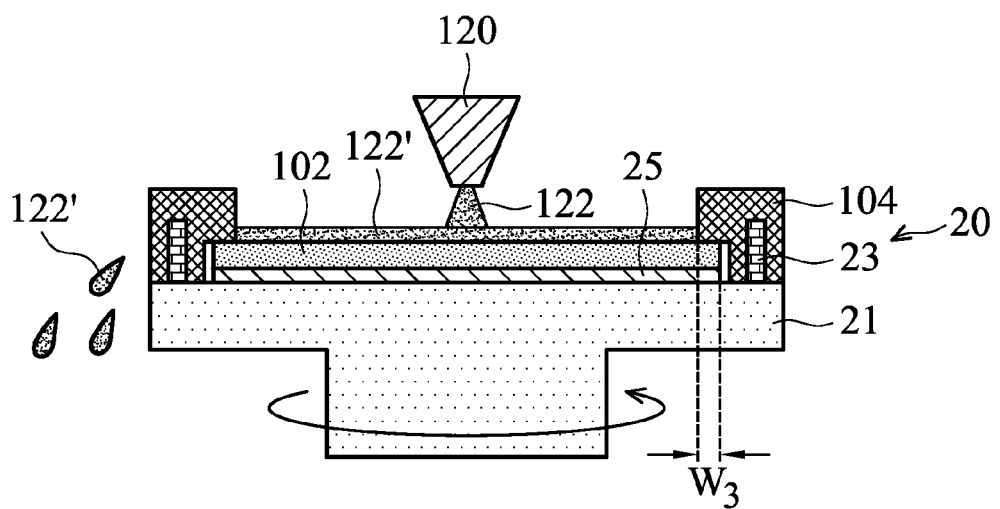

Referring to FIG. 2C, etching mask 104 and pins 23 are assembled, and etching mask 104 is secured to etching support assembly 20. In some embodiments, etching mask 104 is held in place by its weight and is secured to etching support assembly 20 by pins 23. In some embodiments, etching mask 104 is secured to etching support assembly 20 by fastening devices, such as screws. In some other embodiments, etching mask 104 is secured to etching support assembly 20 by vacuum.

As shown in FIG. 2C, a part of the extending portion of etching mask 104 directly contacts peripheral portions of wafer 102. Therefore, the peripheral portions of wafer 102 are protected by the extending portion of etching mask 104 during the wet etching process. The peripheral portions of wafer 102 which are in direct contact with the extending portion of etching mask 104 are etch exclusion portions and have a width $W_3$. In some embodiments, width $W_3$ is in a range from about 1.5 mm to about 3 mm. In some embodiments, width $W_3$ is no larger than 3 mm.

As shown in FIG. 2C, when the wet etching process is performed on wafer 102, a mixture 122', which includes etchant 122 provided by etching supplier 120 and removed material of wafer 102, flows on wafer 102 and is expelled from wafer 102 through openings 105 of etching mask 104.

Wafer 102 may be spun by chuck 21 during the wet etching process to uniformly spread etchant 122. In some embodiments, the spinning rate of wafer 102 is in a range from about 50 rpm to 3000 rpm. In some embodiments, wafer 102 is heated to speed up the etching rate of the wet etching process. In some embodiments, wafer 102 is heated to a temperature in a range from about 30 degrees to about 70 degrees.

Figure 2D:
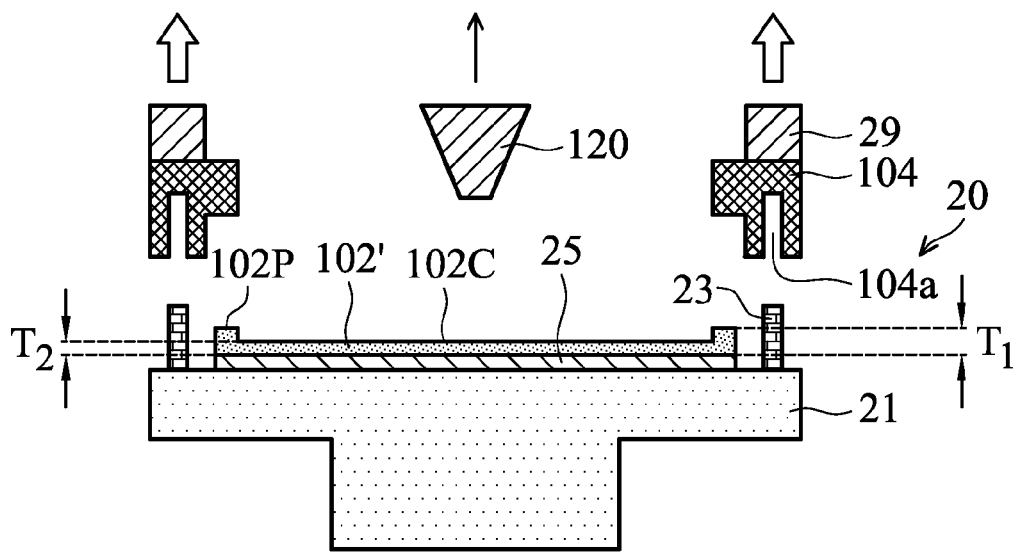

Referring to FIG. 2D, after the wet etching process, etching mask 104 is removed from etching support assembly 20 by vacuum holder 29, and then etching supplier 120 is removed. However, when etching mask 104 is fastened to etching support assembly 20 by fastening devices, etching mask 104 needs to be disassembled first.

As shown in FIG. 2D, after the wet etching process, wafer 102 in FIG. 2A becomes a thinned wafer 102' having peripheral portions 102P with a thickness $T_1$ and a central portion 102C with a thickness $T_2$. In some embodiments, thickness $T_1$ is in a range from about 500 um to about 950 um. In some embodiments, thickness $T_2$ is in a range from about 50 um to about 200 um. In some embodiments, thickness $T_1$ is equal to the original thickness of wafer 102. In some other embodiments, thickness $T_1$ is slightly smaller than the original thickness of the wafer 102. In some embodiments, thickness $T_1$ is smaller than 700 μm. In some embodiments, a difference between thickness $T_1$ and thickness $T_2$ is no larger than 50 μm.

Figure 2E:
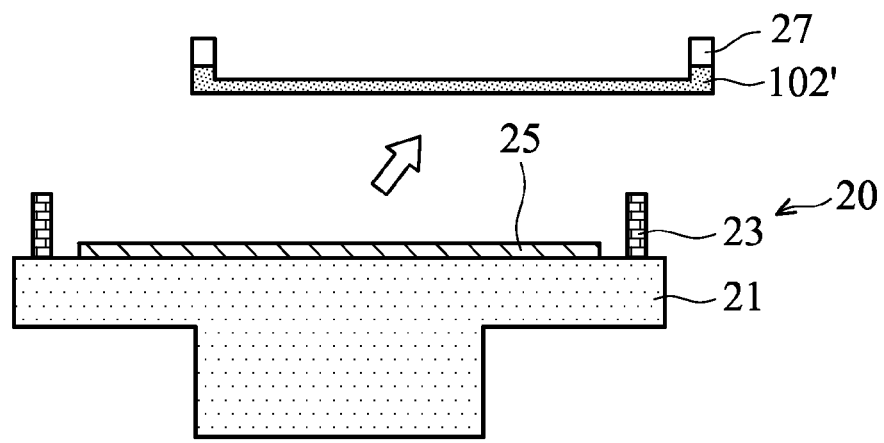

Referring to FIG. 2E, thinned wafer 102' is removed by vacuum wands 27 from etching support assembly 20 for subsequent processes, as indicated by the arrow. As mentioned above, thinned wafer 102' has thick peripheral portions 102P and thin central portion 102C. Such thick peripheral portions 102P enable thinned wafer 102' to be handled and transferred without breaking.

Figure 2F:
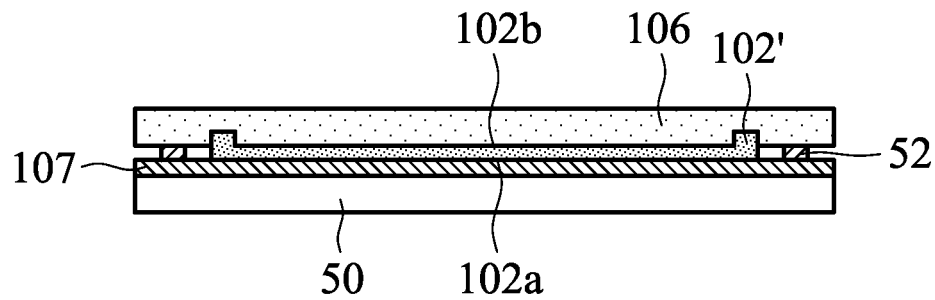

Referring to FIG. 2F, after the wet etching process, a dicing tape 106 is adhered to thinned wafer 102' in accordance with some embodiments. As shown in FIG. 2F, thinned wafer 102' is placed on a platen 50, and a protection layer 107 is used to protect front-side 102a of wafer 102' from directly contacting with platen 50. Dicing tape 106 is then adhered to backside 102b of thinned wafer 102' to assist with the subsequent dicing process. As shown in FIG. 2F, a dicing supporter 52 is also used to prevent dicing tape 106 adhering to protection layer 107 on platen 50. Since thinned wafer 102' has thicker peripheral portions 102P, it is easier to transfer thinned wafer 102' to platen 50. In some embodiments, a dicing process is performed to thinned wafer 102' with dicing tape 106 attached thereon.

Figure 3:
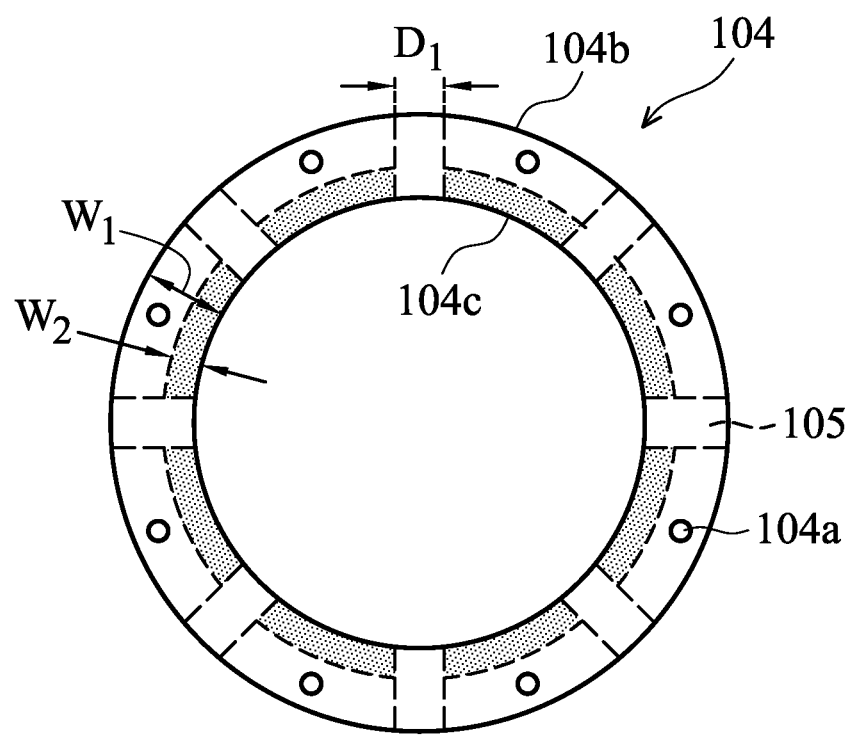
FIG. 3 shows a bottom-view representation of etching mask used in the processes illustrated in FIG. 2A to FIG. 2E in accordance with some embodiments of the disclosure.

FIG. 3 shows a bottom-view representation of etching mask 104 used in the processes illustrated in FIG. 2A to FIG. 2D in accordance with some embodiments of the disclosure. Referring to FIG. 3, etching mask 104 is in a shape of a ring having outer edge 104b and inner edge 104c. As described previously, width $W_1$ represents a width between outer edge 104b and inner edge 104c of etching mask 104, and width $W_2$ represent the width of the extending portion of etching mask 104. In addition, openings 105 of etching mask 104 have a width $D_1$. In some embodiments, the width $D_1$ is in a range from about 1 mm to about 10 mm.

Figure 4A:
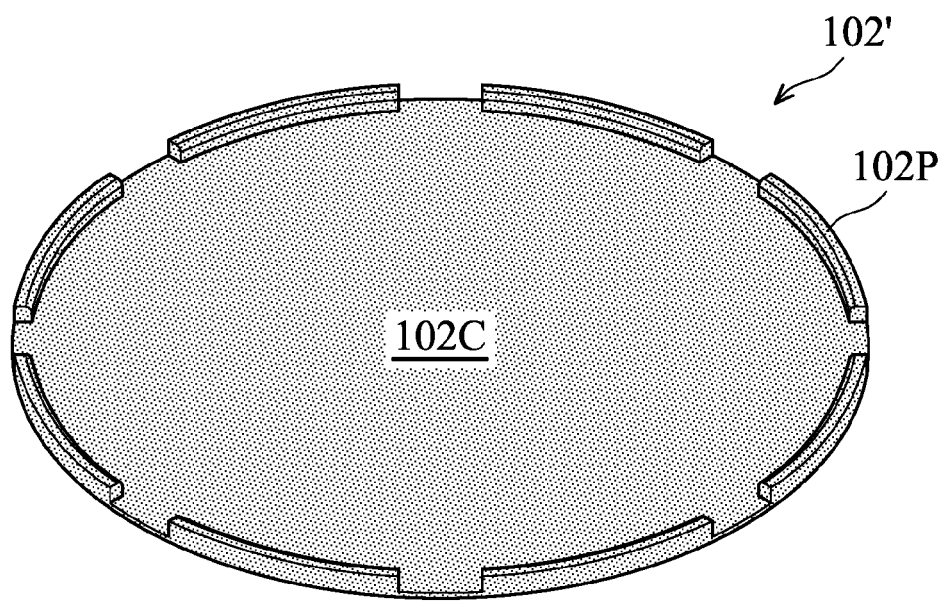
FIG. 4A shows a top-view representation of a thinned wafer in accordance with some embodiments of the disclosure.

FIG. 4A shows a top-view representation of thinned wafer 102' thinned by the process illustrated in FIG. 2A to FIG. 2E in accordance with some embodiments of the disclosure. After the wet etching process, thinned wafer 102' has thick peripheral portions 102P and thin central portion 102C. Thick peripheral portions 102P facilitate the handing of thinned wafer 102'. The pattern of thick peripheral portions 102P corresponds to the extending portions of etching mask 104. As shown in FIG. 4A, thick peripheral portions 102P form a non-continuous ring-like structure with openings along the ring.

Figure 4B:
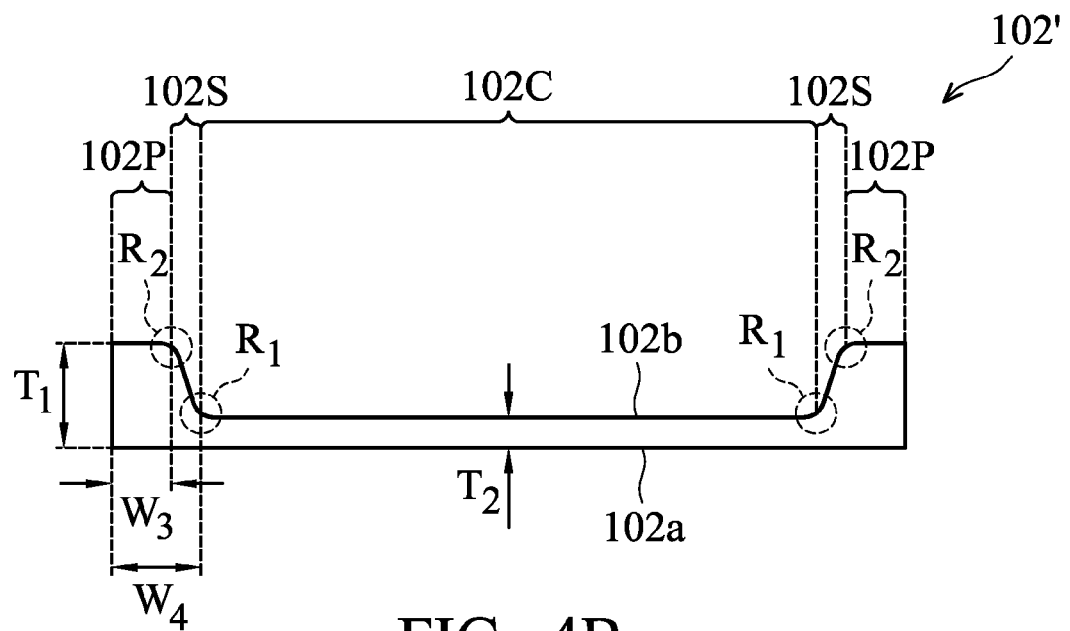
FIG. 4B shows a cross-sectional representation of a thinned wafer in accordance with some embodiments of the disclosure.

FIG. 4B shows a cross-sectional representation of thinned wafer 102' illustrated in FIG. 4A in accordance with some embodiments of the disclosure. Sidewall portions 102S are between peripheral portions 102P and central portion 102C. As shown in FIG. 4B, sidewall portions 102S have a gradually increased thickness from central portion 102C (with thickness $T_2$) to peripheral portions 102P (with thickness $T_1$).

As shown in FIG. 4B, a region $R_1$ between central portion 102C and sidewall portions 102S and a region $R_2$ between sidewall portions 102S and peripheral portions 102P have smooth and rounded shapes without any sharp angles or micro-cracks.

If wafer 102 is thinned by the grinding process (which involves mechanical movements), the edge of the thinned wafer could have sharp angles at its edges, resulting in stress concentration on the thinned wafer. Therefore, the edge of the thinned wafer could easily break. In contrast, when wafer 102 is thinned by the wet etching process (which is a chemical process with less mechanical force), the edge of thinned wafer 102' does not have sharp angles but are smooth. Since thinned wafer 102' does not have sharp angles (which causes stress concentration on the wafer), chipping and/or breakage of thinned wafer 102' is avoided.

Compared to the wafer thinned by grinding process, wafer 102 is thinned by wet etching process described above. The wet etching process involves several advantages.

Firstly, the wafer thinned by grinding process is consistently thin and fragile. In addition, since the wafer thinned by grinding process is brittle, temporary supporting structures (e.g. a tape) are needed to support the thinned wafer. Furthermore, additional operations for removing the supporting structures are needed. In contrast, thick peripheral portions 102P of thinned wafer 102' can be used as a supporting structure when handling thinned wafer 102'. Therefore, additional temporary supporting structures are not required, and fabrication processes and cost are reduced.

Secondly, the wafer thinned by grinding process usually has scratches formed on the thinned wafer. Therefore, an additional polish process (such as a CMP process) is required after the grinding process. However, thinned wafer 102' has no scratches on its surface after the wet etching process, and the additional polish process is not needed.

Thirdly, the wafer thinned by grinding process has sharp angles at its edge, resulting in stress concentration. In contrast, stress concentration of thinned wafer 102' is avoided for having smooth edges.

Fourthly, when the wafer is thinned by the grinding process, the thinned wafer tends to be broken during the transferring. In order to prevent the edge of the thinned wafer from being broken, the grinding process and the frame mounting process need to be integrated in an in-line processing system. However, a throughput mismatch issue may be generated in the in-line processing system. In contrast to the wafer thinned by the grinding process with the entire wafer having the same thickness, thick peripheral portions 102P of thinned wafer 102' provides support during wafer transferring. In addition, the etching process and the frame mounting process may be performed by stand-alone equipments.

Figure 5A:
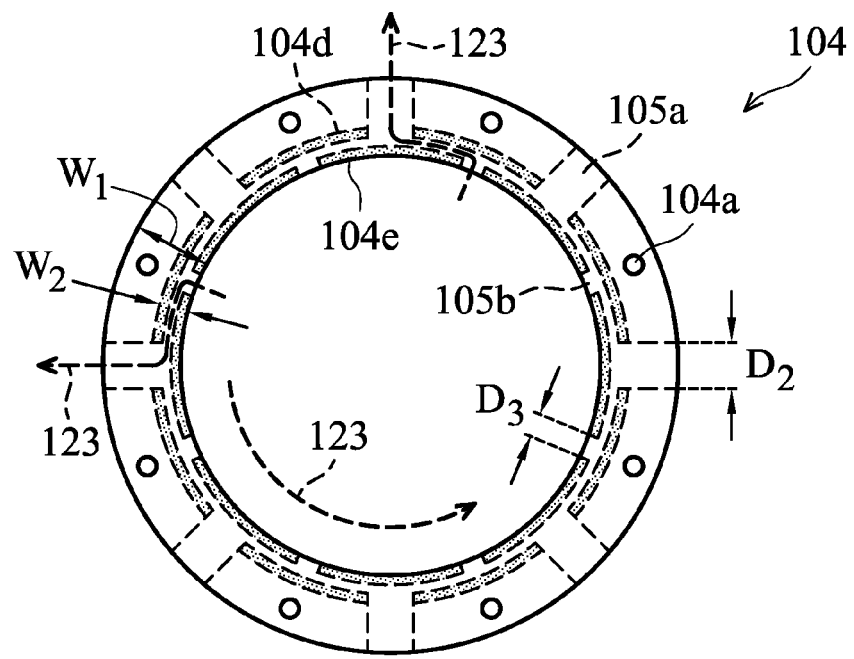
FIG. 5A shows a bottom-view representation of etching mask in accordance with some other embodiments of the disclosure.
Figure 5B:
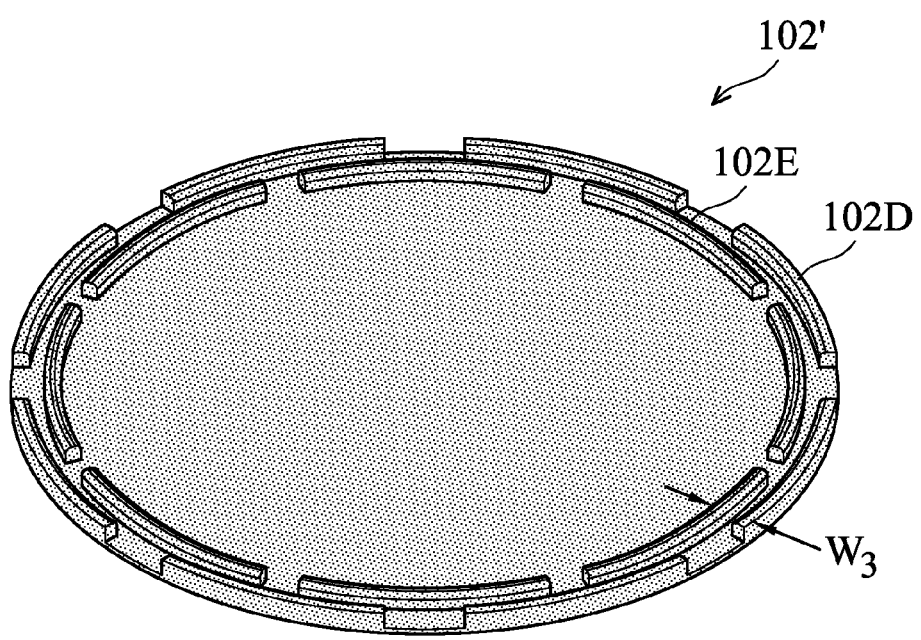
FIG. 5B shows a top-view representation of thinned wafer thinned by using etching mask illustrated in FIG. 5A in accordance with some other embodiments of the disclosure.

FIG. 5A shows a bottom-view representation of etching mask 104 in accordance with some other embodiments of the disclosure. FIG. 5B shows a top-view representation of thinned wafer 102' thinned by using etching mask 104 illustrated in FIG. 5A. As shown in FIG. 5A, etching mask 104 is in a shape of a ring with outer portions 104d and inner portions 104e. Outer portions 104d of etching mask 104 form a ring-shape pattern with openings 105a and inner portions 104e of etching mask 104 form a ring-shape pattern with openings 105b. Openings 105a have a width $D_2$. In some embodiments, width $D_2$ is in a range from about 5 mm to 20 mm. Openings 105b have a width $D_3$. In some embodiments, width $D_3$ is in a range from about 5 mm to 20 mm. As shown in FIG. 5A, openings 105a and openings 105b are not aligned to each other. In some embodiments, during the wet etching process, etching flowing path 123 is in a clockwise direction, and etchant 122 is expelled from etching mask 104 through opening 105a and 105b. In some other embodiments, the etching flowing path is in a counter-clockwise direction (not shown).

As shown in FIG. 5B, since outer portions 104d of etching mask 104 have a ring-shape pattern with openings 105a, thinned wafer 102' also has an outer ring-shape pattern 102D on its peripheral regions. In addition, since inner portions 104e of etching mask 104 have ring-shape pattern with openings 105b, thinned wafer 102' also has an inner ring-shape pattern 102E on its peripheral regions. As shown in FIG. 5B, outer ring-shape pattern 102D and inner ring-shape pattern 102E are etch exclusion portions with a width $W_3$ measured from an inner edge of inner ring-shape pattern 102E to an outer edge of outer ring-shape pattern 102D. In some embodiments, the width $W_3$ is in a range from about 1.5 mm to 3 mm.

Figure 6:
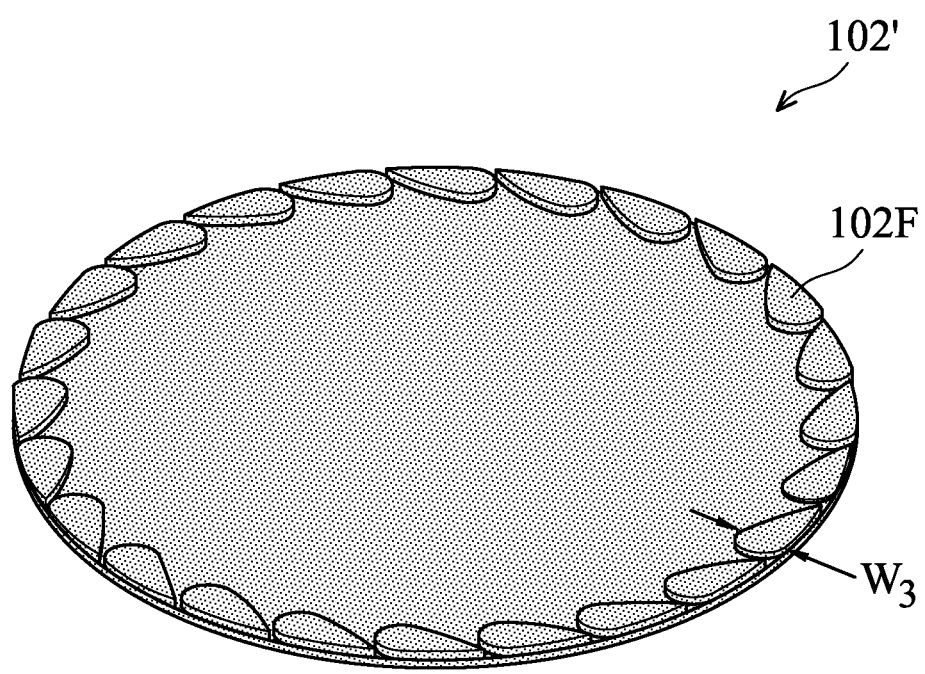
FIG. 6 shows a top-view representation of thinned wafer in accordance with some other embodiments of the disclosure.

FIG. 6 shows a top-view representation of thinned wafer 102' in accordance with some other embodiments of the disclosure. Referring to FIG. 6, thinned wafer 102' has a pattern including water drop-like portions 102F, which are arranged in a clockwise direction. Accordingly, etching mask 104 used for forming thinned wafer 102' in this embodiment also has water drop-like portions (not shown). The water drop-like portions on etching mask 104 may assist with the flowing of etchant 122 during the wet etching process. As shown in FIG. 6, the water drop-like portions of thinned wafer 102' are etch exclusion portions with a width $W_3$ measured from an inner edge to an outer edge of the water drop-like portions. In some embodiments, the width $W_3$ is in a range from about 1.5 mm to 3 mm.

It is noted that patterns of etching mask 104 are not limited to above-mentioned patterns, and etching mask 104 may have other designs or patterns. The numbers of the openings may be adjusted according to actual applications.

Figure 7A:
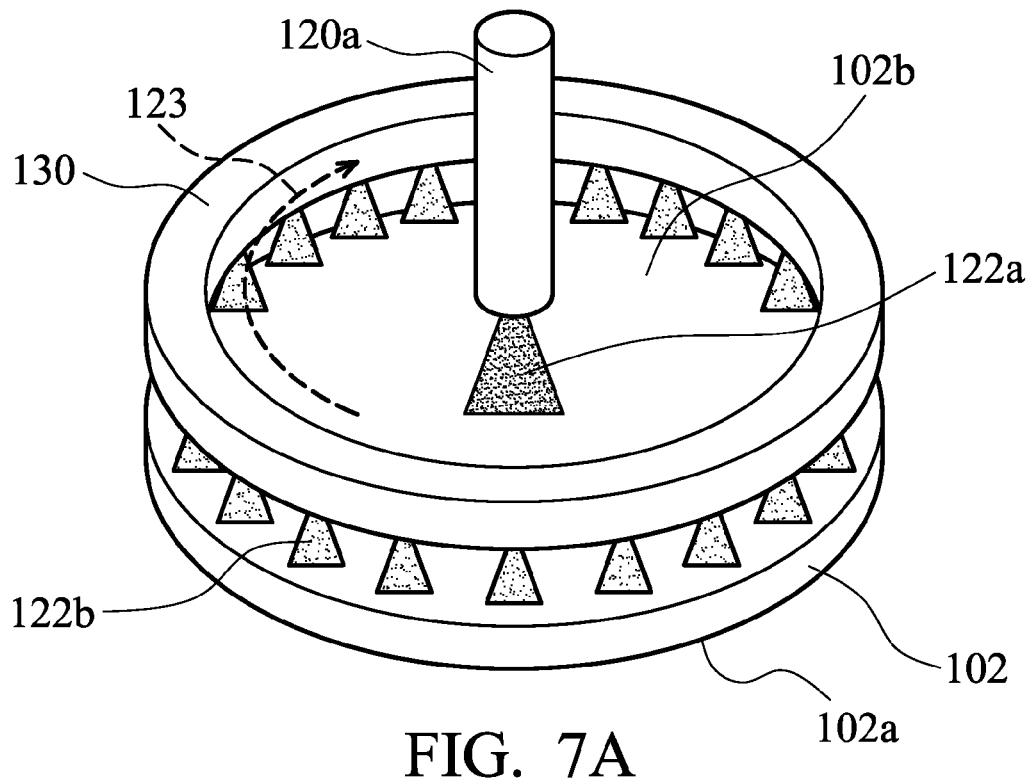
FIG. 7A shows a cross-sectional representation of a system for thinning a wafer in accordance with some embodiments of the disclosure.
Figure 7B:
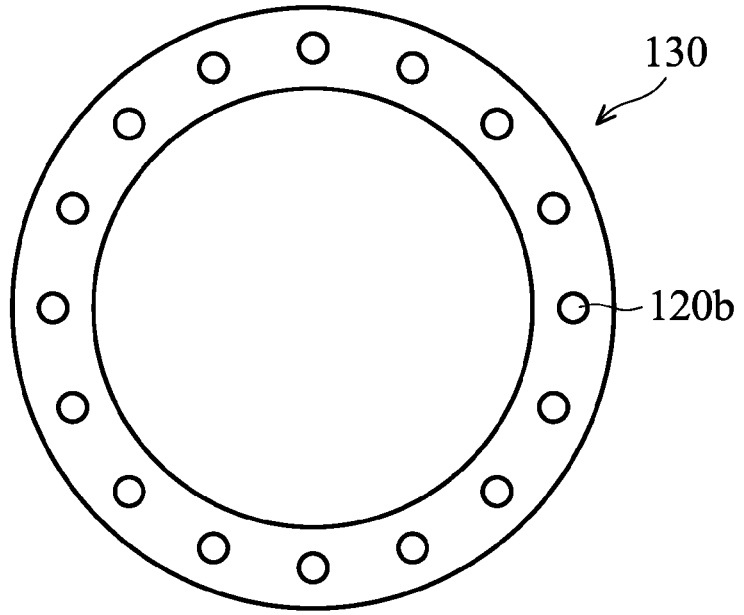
FIG. 7B shows a bottom view of a nozzle ring used in the system illustrated in FIG. 7A in accordance with some embodiments of the disclosure.

FIG. 7A shows a cross-sectional representation of a system for thinning wafer 102 in accordance with some embodiments of the disclosure, and like elements are identified by the same reference numbers as in FIG. 1 and are omitted for brevity. FIG. 7B shows a bottom view of a nozzle ring 130 used in the system illustrated in FIG. 7A in accordance with some embodiments of the disclosure.

Referring to FIG. 7A, a first nozzle 120a is positioned on the central region of backside 102b of wafer 102, and a nozzle ring 130 is positioned on the peripheral region of backside 102b of wafer 102 to perform the wet etching process. Nozzle ring 130 includes a plurality of second nozzles 120b, as shown in FIG. 7B. During the wet etching process, first nozzle 120a is used to provide an etchant 122a, and second nozzles 120b on nozzle ring 130 are used to provide a solvent 122b. Etchant 122a is used to etch the central region of wafer 102, and solvent 122b is used to dilute the concentration of etchant 122a on the peripheral region of wafer 102. Therefore, the etching rate on the central region of wafer 102 is higher than that on the peripheral region of wafer 102, and a difference in thickness of thinned wafer 102' will be generated by the different etching rates.

In some embodiments, etchant 122a is made of an acid solution, including hydrofluoric acid (HF), nitric acid ($HNO_3$) or combinations thereof. The solvent 122b includes water or isopropyl alcohol (IPA). In some embodiments, the etchant 122 is made of an acid solution including hydrofluoric acid (HF) with a concentration in a range from about 10% to 50% mixed with nitric acid ($HNO_3$) with a concentration in a range from about 10% to 50%. In some embodiment, first nozzle 102a and nozzle ring 130 are connected to liquid suppliers.

Figure 8A:
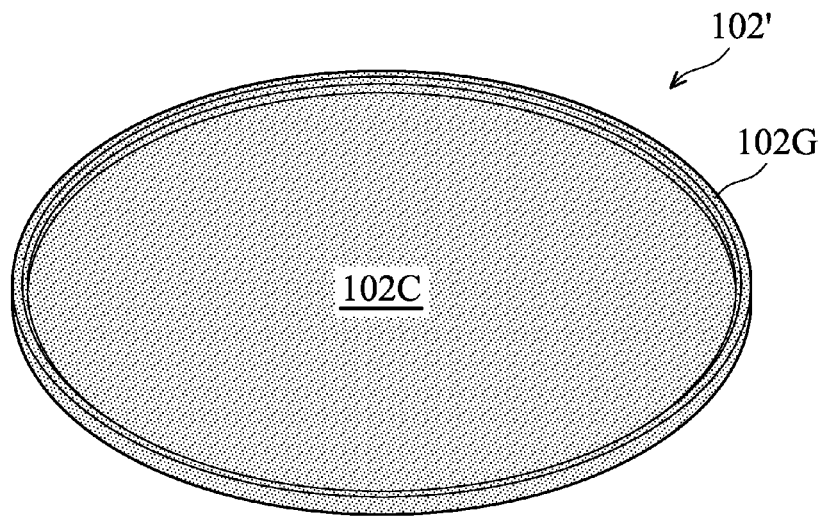
FIG. 8A shows a top-view representation of thinned wafer after wet etching process illustrated in FIG. 7A in accordance with some embodiments of the disclosure.
Figure 8B:
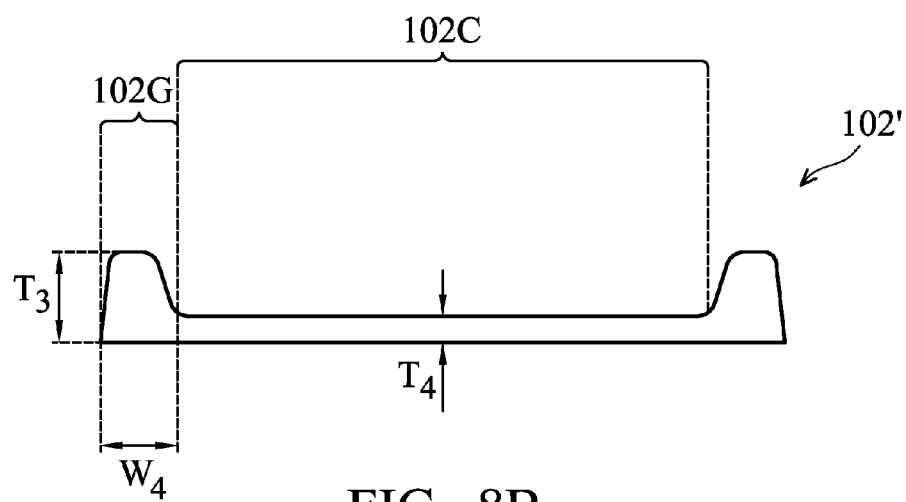
FIG. 8B shows a cross-section representation of thinned wafer illustrated in FIG. 8A in accordance with some embodiments of the disclosure.

FIG. 8A shows a top-view representation of thinned wafer 102' after wet etching process illustrated in FIG. 7A in accordance with some embodiments of the disclosure. FIG. 8B shows a cross-section representation of thinned wafer 102' illustrated in FIG. 8A in accordance with some embodiments of the disclosure. As shown in FIG. 8B, after the wet etching process shown in FIG. 7A, thinned wafer 102' has thick peripheral portion 102G with a thickness $T_3$ and central portion 102C with the thickness $T_4$. The difference of the thickness results from different etching rates on wafer 102 during the wet etching process. Thickness $T_3$ is smaller than an original thickness of wafer 102 but larger than thickness $T_4$. In some embodiments, thickness $T_3$ is in a range from about 300 um to about 950 um. In some embodiments, thickness $T_4$ is in a range from about 50 um to about 200 um. In some embodiments, a difference between thickness $T_3$ and thickness $T_4$ is in a range from about 100 um to about 900 um. Thick peripheral portion 102G facilitates handling of thinned wafer 102'. The pattern of thick peripheral portion 102G corresponds to that of nozzle ring 130 and has a width $W_4$. In some embodiments, width $W_4$ is in a range from about 1 mm to about 3 mm. In some embodiments, width $W_4$ is no larger than 3 mm.

As mentioned above, thinned wafer 102' has a thick peripheral portion(s), such as portions 102P, 102D, 102E, 102F, and 102G, and the thick peripheral portion(s) enable the thinned wafer to be handled and transferred without breaking. Therefore, additional operations for applying and removing temporary supporting structures are not required, and the fabrication processes and cost of the thinned wafer are decreased.

Embodiments of mechanisms for thinning a wafer are provided. The wafer is thinned by a wet etching process. An etching mask or nozzle ring may be used in the wet etching process to form a thinned wafer with a thicker peripheral portion(s). The thicker peripheral portion enables handling and transferring the thinned wafer without breaking the thinned wafer. As a result, processes can be simplified.

In some embodiments, a method for thinning a wafer is provided. The method includes placing a wafer on a support assembly and securing an etching mask to a backside of the wafer. The etching mask covers a peripheral portion of the wafer. The method further includes performing a wet etching process on the backside of the wafer to form a thinned wafer, and the thinned wafer includes peripheral portions having a first thickness and a central portion having a second thickness smaller than the first thickness.

In some embodiments, a method for thinning a wafer is provided. The method includes placing a wafer on a support assembly. The method also includes performing a wet etching process on a backside of the wafer to form a thinned wafer. The wet etching process includes positioning a first nozzle on a central portion of the backside of the wafer and positioning a nozzle ring on a peripheral portion of the backside of the wafer. The thinned wafer includes a peripheral portion having a first thickness and a central portion having a second thickness smaller than the first thickness.

In some embodiments, an etching mask used in a method for thinning a wafer is provided. The etching mask is in a shape of a ring and is made of an acid resistant material.

While the disclosure has been described by way of example and in terms of the embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for thinning a wafer, comprising:
   placing a wafer on a support assembly;
   securing an etching mask to a backside of the wafer, wherein the etching mask covers a peripheral portion of the wafer, and wherein the etching mask is in a shape of a ring and has an extending portion on the ring, and the extending portion has a non-continuous ring-like structure; and
   performing a wet etching process on the backside of the wafer to form a thinned wafer, wherein the thinned wafer comprises non-continuous ring-like peripheral portions having a first thickness and a central portion having a second thickness smaller than the first thickness.

2. The method for thinning a wafer as claimed in claim 1, wherein the first thickness is in a range from about 500 um to 950 um, and the second thickness is in a range from about 50 um to 200 um.

3. The method for thinning a wafer claimed in claim 1, wherein the peripheral portions of the thinned wafer directly contacts a part of the extending portion.

4. The method for thinning a wafer as claimed in claim 1, wherein the peripheral portions has a width in a range from about 1.5 mm to about 3 mm.

5. The method for thinning a wafer as claimed in claim 1, wherein the extending portion has a width in a range from about 1.5 mm to about 3 mm.

6. The method for thinning a wafer as claimed in claim 1, wherein the etching mask is in a shape of a ring.

7. The method for thinning a wafer as claimed in claim 1, wherein the etching mask has a plurality of openings.

8. The method for thinning a wafer as claimed in claim 1, further comprising:
   positioning an etching supplier on the backside of the wafer to provide an etchant during the wet etching process.

9. The method for thinning a wafer as claimed in claim 8, wherein the etchant comprises hydrofluoric acid (HF), nitric acid ($HNO_3$), or combinations thereof.

10. A method for thinning a wafer, comprising:
    placing a wafer on a support assembly;
    performing a wet etching process on a backside of the wafer to form a thinned wafer, wherein the wet etching process comprises:
       positioning a first nozzle on a central portion of the backside of the wafer; and
       positioning a nozzle ring on a peripheral portion of the backside of the wafer;
    wherein the thinned wafer comprises a peripheral portion having a first thickness and a central portion having a second thickness smaller than the first thickness.

11. The method for thinning a wafer as claimed in claim 10, wherein a backside of the nozzle ring comprises a plurality of second nozzles.

12. The method for thinning a wafer as claimed in claim 11, wherein the first nozzle is used to provide an etchant, and the second nozzles are used to provide a solvent.

13. The method for thinning a wafer as claimed in claim 12, wherein the etchant comprises hydrofluoric acid (HF), nitric acid ($HNO_3$), or combinations thereof.

14. The method for thinning a wafer as claimed in claim 12, wherein the solvent comprises water or isopropyl alcohol (IPA).

15. The method for thinning a wafer as claimed in claim 10, wherein the nozzle ring is in a shape of a ring.

16. The method for thinning a wafer as claimed in claim 10, wherein the first thickness is in a range from about 300 um to 950 um, and the second thickness is in a range from about 50 um to 200 um.

* * * * *